United States Patent
Matsuura

(10) Patent No.: US 6,714,261 B1
(45) Date of Patent: Mar. 30, 2004

(54) CATV TUNER FOR HIGH SPEED DATA COMMUNICATION UTILIZING A DIFFERENT FREQUENCY BAND

(75) Inventor: Syuuji Matsuura, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/556,099

(22) Filed: Apr. 20, 2000

(30) Foreign Application Priority Data

Apr. 23, 1999 (JP) .......................................... 11-116600
Dec. 17, 1999 (JP) .......................................... 11-358749

(51) Int. Cl.[7] .......................... H04N 5/50; H04N 7/173
(52) U.S. Cl. ..................... 348/731; 725/111; 725/131
(58) Field of Search .................... 348/731, 707, 348/678; 725/131, 100, 111, 151, 95; 455/180.2, 188.1, 188.2, 190.1, 200.1, 232.1

(56) References Cited

U.S. PATENT DOCUMENTS

| | | | | |
|---|---|---|---|---|
| 4,520,507 A | * | 5/1985 | Moon | 458/3 |
| 4,612,571 A | * | 9/1986 | Moon | 358/86 |
| 5,345,504 A | | 9/1994 | West, Jr. | |
| 5,425,027 A | | 6/1995 | Baran | |
| 5,881,362 A | | 3/1999 | Eldering et al. | |
| 6,124,766 A | | 9/2000 | Matsuura | |
| 6,131,023 A | | 10/2000 | Matsuura | |
| 6,160,571 A | * | 12/2000 | Wang | 348/10 |
| 6,160,572 A | | 12/2000 | Matsuura | |
| 6,522,872 B1 | * | 2/2003 | Nishimura et al. | 455/301 |

2001/0011695 A1   8/2001   Matsuura

FOREIGN PATENT DOCUMENTS

| | | |
|---|---|---|
| EP | 0 851 580 A1 | 7/1998 |
| JP | 59-215185 A | 12/1984 |
| JP | A5259932 | 10/1993 |
| JP | A6022232 | 1/1994 |
| JP | A670246 | 3/1994 |
| JP | A6062330 | 3/1994 |
| JP | 6-253276 A | 9/1994 |
| JP | 7-30456 A | 1/1995 |
| JP | 7-38384 A | 2/1995 |
| JP | 9-64769 A | 3/1997 |
| JP | A10304261 | 11/1998 |

* cited by examiner

*Primary Examiner*—Victor R. Kostak
(74) *Attorney, Agent, or Firm*—Birch, Stewart, Kolasch & Birch, LLP

(57) ABSTRACT

A tuner has a receiving unit receiving a signal input from a CATV station to an HPF. In the receiving unit, the signal is attenuated by a PIN attenuator circuit with the gain based on the signal level, thereafter the signal is amplified over a broad frequency range by a buffer amplifier, the high frequency component is amplified by a high frequency amplifier, and converted to a desired intermediate frequency signal by a frequency converting circuit including an oscillating circuit and a mixing circuit. Thereafter, the signal is IF-amplified by an IF amplifier and output through a terminal. As the signal input to the amplifier succeeding the PIN attenuator circuit is prevented from attaining a high level, signal distortion at the time of amplification can be improved, and supply current to the amplifier can be reduced.

11 Claims, 12 Drawing Sheets

CATV TUNER FOR HIGH SPEED DATA COMMUNICATION UTILIZING A DIFFERENT FREQUENCY BAND

BACKGROUND OF THE INVENTION

1. Field of the Invention

The present invention relates to a CATV tuner. More specifically, the present invention relates to a cable modem tuner incorporated in a cable modem used for enabling high speed data communication at home, utilizing an unused channel of cable television (hereinafter referred to as CATV), and a CATV tuner used for a digital set box (hereinafter referred to as STB) for high speed data communication at home utilizing a different frequency band.

2. Description of the Background Art

In a CATV system, introduction of HFC (Hybrid Fiber/Coax) has been in progress, in which a coaxial cable is kept as a subscriber's drop wire and the main network is implemented by optical fibers. This system attempts to provide broad-band data communication service of several Mbits/sec at home. Utilizing this system, it is possible to realize high speed data line having the transmission rate of 30 Mbits/sec with the band width of 6 MHz using 64 QAM (Quadrature Amplitude Modulation), which may not be called the state of the art any more. The cable modem is used in this system, and realizes high speed data communication of 4 Mbits/sec to 27 Mbits/sec, utilizing an unused channel of CATV.

FIG. 11 is a block diagram of a conventional cable modem tuner. An up signal transmitted from the cable modem tuner to a CATV station, not shown, has the frequency of 5 MHz to 42 MHz, and a down signal transmitted from the CATV station to the cable modem tuner has the frequency of 54 MHz to 860 MHz, and transmitted to a cable network through a CATV input terminal 11 of the tuner. The up signal transmitted from the cable modem is received by a data receiver of the CATV station (system operator), and enters a computer of a center. In the cable modem, a data signal subjected to quadrature phase shift keying from a QPSK transmitter, not shown, is input to a data terminal 10, as the up signal. The data signal is transmitted through an upstream circuit 9 and an input terminal 11, to the CATV station.

The down signal is passed through an HPF (High Pass Filter) 1 as an IF (Intermediate Frequency) filter having an attenuation range of 5 to 42 MHz and a passband of not lower than 54 MHz and to a buffer amplifier 35 to be supplied to various circuits of the succeeding stages.

The circuits of the succeeding stages provide receiving circuits for UHF band (B3 band) having the frequency of 470 to 860 MHz, VHF High band (132 band) of 170 to 470 MHz and VHF Low band (B1 band) of 54 to 170 MHz, respectively. Band division is not limited thereto.

Further, the cable modem tuner includes, in addition to the receiving circuits described above, IF amplifying circuits 19 and 21, an SAW filter 20, an IF output terminal 12 and a PLL channel selection circuit 27.

The receiving circuits for the B1 to B3 bands described above respectively include input switching circuits 200, 140 and 220; UHF high frequency amplification input tuning circuits 300, VHF HIGH BAND high frequency amplification input tuning circuit 150 and VHF LOW BAND high frequency amplification input tuning circuit 230; a UHF high frequency amplifier 4, a VHF HIGH BAND high frequency amplifier 16 and a VHF LOW BAND high frequency amplifier 24; a UHF high frequency amplification output tuning circuit 50, VHF HIGH BAND high frequency amplification output tuning circuit 170 and VHF LOW BAND high frequency amplification output tuning circuit 250; a UHF mixing circuit 6, a VHF HIGH BAND mixing circuit 18 and a VHF LOW BAND mixing circuit 26; and a UHF oscillating circuit 7, a VHF HIGH BAND oscillating circuit 13 and a VHF LOW BAND oscillating circuit 8, corresponding to the mixing circuits, respectively.

Switching method using a switching diode, or a method using a filter for band splitting is applied to the input switching circuits 200, 140 and 220.

Generally, a dual gate type MOSFET device is used for the high frequency amplifiers 4, 16 and 24. An AGC (Automatic Gain Control) voltage from an AGC terminal 36 is input to the gate electrode of the device, and therefore the gain in these amplifiers is controlled by the AGC voltage.

Input switching circuits 200, 140 and 220 receive as inputs the signals of B1 to B3 bands, and selectively outputs the received signals of prescribed frequency bands only.

High frequency amplification input tuning circuits 300, 150 and 230 tune the received signals selectively output from input switching circuits 200, 140 and 220 to respective desired frequencies (frequencies of the desired channels) using a tuning coil or the like, in respective bands.

High frequency amplifiers 4, 16 and 24 receive the output signals from high frequency amplification input tuning circuits 300, 150 and 230, amplify these signals so as to prevent degradation of SN ratio such as signal distortion, using the voltage level of AGC terminal 36 receiving the AGC voltage as a reference, and output the resulting signals. The RF (high frequency) AGC voltage supplied to AGC terminal 36 is supplied to the gate electrode of the dual gate MOSFET in each of the high frequency amplifiers 4, 16 and 24, and therefore the dual gate MOSFET operates such that the power gain of the high frequency amplifier attains the full gain when the input signal level is higher than 60 dB$\mu$, and operates so that the output level of the tuner is always kept at a constant level when the input signal level is not higher than 60 dB$\mu$, so that degradation of SN ratio such as distortion, of the signal can be prevented.

High frequency amplification output tuning circuits 50, 170 and 250 tune the output signals from high frequency amplifiers 4, 16 and 24 to desired frequencies by using a tuning coil or like in respective bands, and provide the resulting signals.

Local oscillating circuits 7, 13 and 8 oscillate to provide prescribed intermediate frequencies corresponding to respective bands, and mixing circuits 6, 16 and 26 convert the signals output from high frequency amplification output tuning circuits 50, 170 and 250 to desired intermediate frequency signals by using the oscillation signals from the corresponding local oscillating circuits, and therefore, local oscillating circuits 7, 13 and 18 together with the mixing circuits 6, 18 and 26 form frequency converting circuits for respect bands.

Thereafter, the output signals of the receiving circuits are amplified to prescribed levels by an IF amplifying circuit 19, frequency-converted to a prescribed level by SAW filter and IF amplifying circuit 21, and output through IF output terminal 12.

In operation, the down signal passes through HPF1 and applied to input switching circuits 200, 140 and 220. Therefore, among the three receiving circuits, only that receiving circuit of which operational frequency corresponds to the frequency of the down signal operates, and other receiving circuits do not operate. The operations of the receiving circuits are common.

The receiving circuit of each band will be described in the following.

CATV signal is passed through input switching circuits 200, 140 and 220 as well as high frequency amplification input tuning circuits 300, 150 and 230, amplified by high frequency amplifiers 4, 16 and 24, and provided as received signals through high frequency amplification output tuning circuits 50, 170 and 250.

Thereafter, the received signals are passed through mixing circuits 6, 18 and 26 as well as local oscillating circuits 7, 13 and 8 whereby the signals are converted to desired intermediate frequency signals, and subjected to LOW IF conversion by IF amplifying circuits 19 and 21 and SAW filter 20, and provided at output terminal 12.

The above described series of operations are implemented as a channel selection data is transmitted from a CPU, not shown, to PLL channel selection circuit 27 so that the channel is selected accordingly and, at the same time, the input switching circuit for band switching operates in accordance with the band characteristic so that the power supply to respective bands is switched.

A cable modem tuner having a similar structure is also disclosed in Japanese Patent Laying-Open No. 10-304261.

The conventional cable modem tuner described above operates such that it is always kept in a stand-by state for reception. Therefore, low power consumption is necessary. In the double conversion type cable modem tuner described above, power consumption in the stand-by state is 0.7 to 1W, which is relatively large as compared with the power consumption in operation.

More specifically, in the conventional cable modem tuner, the high frequency amplifying circuits 4, 16 and 24 operate independent from each other, and therefore a current for switching operations of these circuits is necessary. Further, when a multiwave signal of the CATV is received at the buffer amplifier 35, the received signal is prone to distortion. In order to solve this problem, it is necessary to supply large current to the device of the buffer amplifier 35.

Further, the cable modem tuner, which is a CATV receiver, receives the multiwave signal in common. Therefore, at least 6 dB of an input return loss is necessary for the entire reception band. Therefore, buffer amplifier 35 is inserted to the input circuit of the conventional cable modem tuner, to improve the input return loss. Further, in the above described conventional cable modem tuner, AGC is realized in the stage of high frequency amplifiers 4, 16 and 24. Such a system is susceptible to intermodulation distortion and mixed modulation distortion.

More specifically, AGC is realized at high frequency amplifiers 4, 16 and 24 of FIG. 11, and the high frequency amplifiers are generally implemented by dual gate type MOSFETs, and therefore linearity in AGC operation is not satisfactory. Further, as the signal level is amplified by buffer amplifier 35, the signals to be applied to high frequency amplifiers 4, 16 and 24 of the succeeding stages come to have high signal level, so that intermodulation distortion and mixed modulation distortion are more likely when the high frequency signal components are amplified.

Further, in the above described conventional cable modem tuner, because of the nature of the dual gate type MOSFETs used for high frequency amplifiers 4, 16 and 24, high frequency parameter component at the input/output fluctuates by the AGC operation, resulting in waveform distortion (waveform fluctuation), which leads to higher possibility of transmission distortion.

Further, as the device characteristics of the high frequency amplifiers 4, 16 and 24 have the above described disadvantages, signal transmission distortion (amplitude distortion) resulting from AGC is highly likely, of which improvement is very difficult.

Further, as the high frequency amplifying circuits 4, 16 and 24 of the conventional cable modem tuner are provided for respective bands, the number of circuit components is considerably large, which is not preferable in view of economy.

In FIG. 11, a cable modem tuner is shown. Recently, a CATV tuner generally referred to as a digital set top box (hereinafter referred to as a STB) has been proposed. The cable modem allows display of the down data signal transmitted from the CATV station to be displayed on a television monitor. The STB branches QPSK modulated down data signal transmitted from the CATV station from the tuner, and signals are processed by a CPU to be output to a personal computer.

Therefore, while the unused channel of CATV in a band between 54 MHz to 860 MHz is used for transmitting the down data signal as described above, different frequency band of 70 MHz to 130 MHz is used in the STB.

FIG. 12 is a schematic block diagram of the STB which includes a branching circuit 37 for branching the down data signal between HPF1 and buffer amplifier 35, and the branched down data signal is output to an OOB (Out Of Band) terminal 38. The OOB terminal outputs the branched data to the CPU. Except this point, the structure is the same as that of FIG. 11.

In the STB shown in FIG. 11, the up signal of the CATV signal has the frequency of 5 MHz to 42 MHz, and the down signal has the frequency of 54 MHz to 860 MHz, and the signals are connected through input terminal 11 to the cable network. The up signal transmitted from the STB is received by a data receiver of the CATV station and input to a computer of the center.

In the STB, a QPSK data signal from a QPSK transmitter (not shown) is provided at data terminal 15 as the up signal. The data signal is input to the STB through the CATV network by the computer at the center, processed by the CPU (not shown) in the STB, and applied to a QPSK modulator. Except this point, the operation is the same as that in the cable modem tuner shown in FIG. 11, and the STB also has the same problems as the cable modem tuner described above.

SUMMARY OF THE INVENTION

Therefore, an object of the present invention is to provide a CATV tuner of which power consumption is saved.

Another object of the present invention is to provide a CATV tuner of which signal distortion can be suppressed.

Briefly described, the present invention provides a CATV tuner including an upstream circuit for transmitting a data signal to a CATV station, a high pass filter for receiving, while removing a data signal, multiwave down signal from the CATV station, and a receiving unit for receiving the down signal provided through the high pass filter, wherein the receiving unit includes a gain control circuit receiving the down signal, attenuating the same with a prescribed gain and thereafter amplifying and outputting the resulting signal, a high frequency amplifying circuit receiving the output signal from the gain control circuit and extracting a frequency signals of respective ranges of different frequency bands, a frequency converting circuit converting the signal output from the high frequency amplifying circuit to a prescribed intermediate frequency signal for each range and outputting the resulting signal, and an intermediate frequency amplifying circuit amplifying the output signal from the frequency converting circuit and providing the resulting signal.

Therefore, according to the present invention, the down signal is attenuated by a prescribed gain at the input unit of the receiving unit, amplified, desired frequency signal is extracted for each range by the high frequency amplifying circuit and amplified, thereafter converted to a desired intermediate frequency signal by the frequency converting circuit for each range, and amplified by the intermediate frequency amplifying circuit to be output. Therefore, the down signal is attenuated by the prescribed gain before amplification at the high frequency amplifying circuit at the input unit. Therefore, even when the down signal as the multiwave signal is received with high input level, generation of a signal distortion can be suppressed. Further, the level of the signal input to the succeeding circuit portion for amplification can be made lower, and therefore current consumption in the high frequency amplifying circuit can be reduced.

In a preferred embodiment of the present invention, a down data signal having a different band from the multiwave down signal from the CATV station is input through the cable to the receiving unit, and the receiving unit includes a branching circuit for branching and outputting the down data signal.

Therefore, in the preferred embodiment, by the branched down data signal, data communication with the CATV station can be established, regardless of the tuner unit.

Further, in a more preferred embodiment, the high frequency amplifying circuit includes an input selecting circuit receiving an output signal from the gain control circuit and selectively outputting the signal to a plurality of ranges dependent on the frequency band, a high frequency amplification input tuning circuit provided for each of the plurality of ranges, receiving the signal for each range selected by the input selecting circuit, tuning the received signal to a desired frequency and outputting the result, a high frequency amplifying circuit provided commonly for the plurality of ranges, amplifying output signals from respective high frequency amplification input tuning circuits and outputting a result, an output selecting circuit receiving the output signal from the high frequency amplifying circuit and selectively outputting signals of a plurality of ranges, and a high frequency amplification output tuning circuit provided for each of the plurality of ranges, receiving the signals of respective ranges selectively output from the output selecting circuit, tuning the signals to desired frequencies and outputting the resulting signals.

In this embodiment, it is unnecessary to provide a high frequency amplifying circuit for each of the plurality of ranges as in the prior art but only one high frequency amplifying circuit is sufficient. Therefore, the current consumption can be reduced, and the number of circuit components constituting the tuner can be reduced, which leads to reduced cost.

More preferably, the high frequency amplifying circuit includes an input selecting circuit receiving an output signal from the input unit and selectively outputting to a plurality of ranges dependent on the frequency band, at least two high frequency filter circuits provided for the plurality of ranges, receiving signals of at least two ranges selected by the input selecting circuit and cutting off the frequencies other than the desired frequency, a high frequency amplifying circuit provided commonly to the plurality of ranges, for amplifying the output signals from the filter circuit and outputting a result, an output selecting circuit receiving the output signal from the high frequency amplifying circuit and selectively outputting signals of at least two ranges, and a high frequency amplification output selecting circuit provided for each of the plurality of ranges, receiving the signals of at least two ranges output from the output selecting circuit, and tuning the signals to the desired frequencies of respective ranges and outputting the result.

Therefore, while the high frequency amplification input tuning circuit and the high frequency amplifying circuit have been provided for each of the plurality of ranges, what is necessary is only to provide at least two high frequency filter circuits for two ranges and one high frequency amplifying circuit. Therefore, the current consumption can be reduced and the number of circuit components can be reduced, whereby the overall cost is reduced.

Further, the gain control circuit includes an attenuating circuit attenuating the down signal with a prescribed gain and providing the result, and a buffer amplifying circuit receiving an output signal from the attenuating circuit, amplifying the same over a broad-band and outputting the result.

Therefore, in the present embodiment, the down signal can be amplified over a broad-band without causing any distortion in the buffer amplifying circuit, and hence the signal distortion at the time of signal reception in the tuner can be improved.

Further, the prescribed gain can be variably set based on the input signal level at the high frequency amplifying unit.

Therefore, the amount of attenuation of the signal by the gain control circuit can be determined based on the level of the signal input to the high frequency amplifying circuit of the succeeding stage. Therefore, the level of the down signal to be applied to the high frequency amplifying circuit can be set to such a level that allows stable operation of the high frequency amplifying circuit not causing signal distortion. As a result, even when the down signal is input at high level to the high frequency amplifying circuit, distortion at the time of signal transmission can be avoided.

Further, at least one of the input selecting circuit and the output selecting circuit includes a plurality of switching elements operating based on the input signal level, and a plurality of inductor elements of which switching is controlled in accordance with the operation of the plurality of switching elements. The input signal is selectively output to the plurality of ranges by the switching control of the plurality of inductor elements in accordance with the operation of the plurality of switching elements.

Therefore, in the present embodiment, the circuit structure necessary for switching between ranges can be simplified by the switching of the inductor elements in accordance with the operation of the switching diode element. Therefore, the number of components can be reduced, leading to lower cost, and the current consumption can be reduced.

Further, the high frequency filter circuit includes a combination circuit of a high pass filter and a low pass filter of which cut off frequencies are variable, and the high frequency amplifying circuit includes a bipolar transistor or a dual gate transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following.

Figure 1:
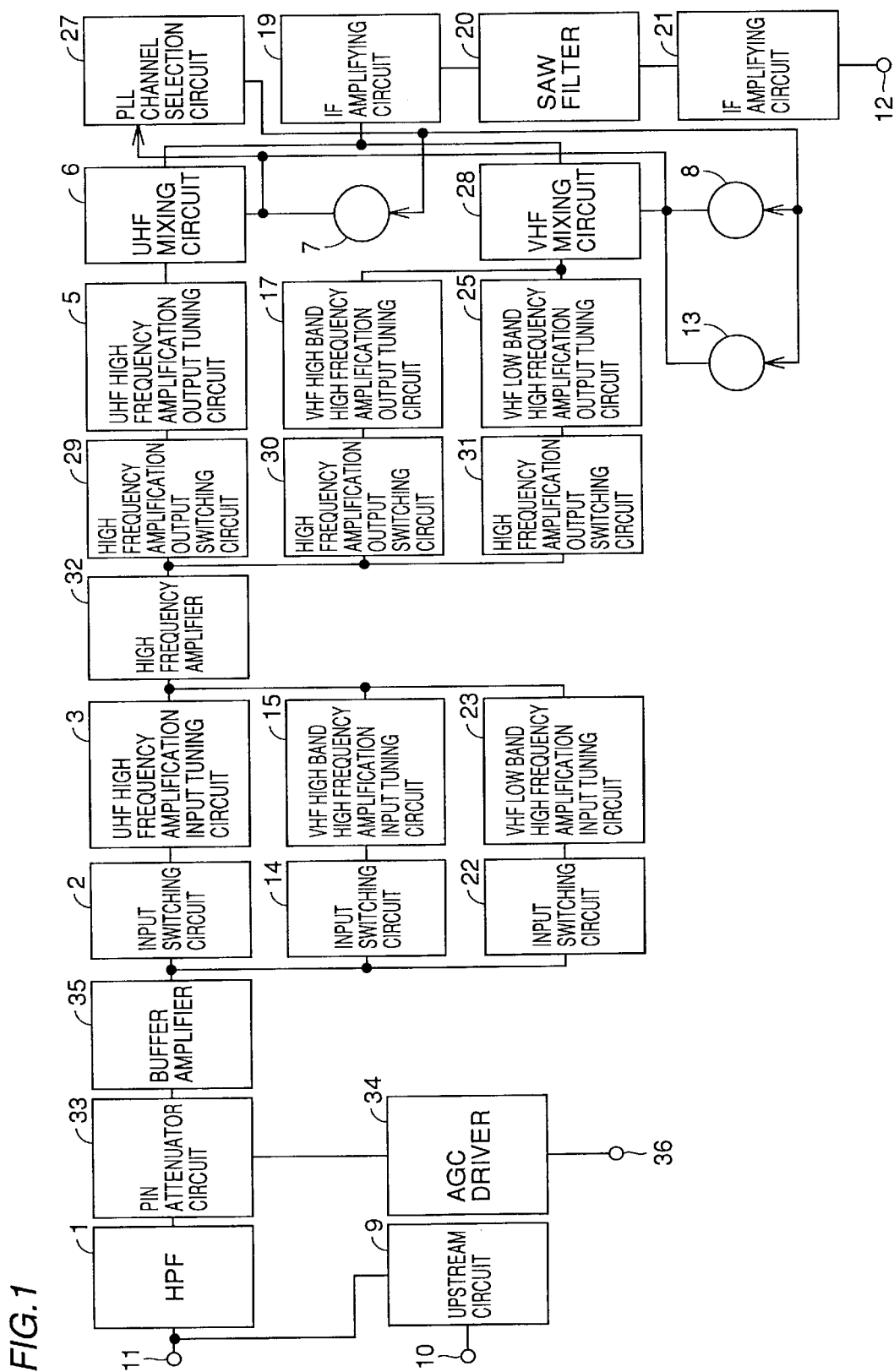
FIG. 1 is a block diagram of a cable modem tuner in accordance with a first embodiment of the present invention.

FIG. 1 is a block diagram of the cable modem tuner in accordance with an embodiment of the present invention. Referring to FIG. 1, the cable modem tuner includes a CATV input terminal 11, a data terminal 10, HPF 1, a PIN attenuator circuit 33, an AGC driver 34 and an AGC terminal 36 related to the circuit 33, a buffer amplifier 35, input switching circuits 2, 14 and 22, UHF, VHF HIGH BAND and VHF LOW BAND high frequency amplifiers 3, 15 and 23, a high frequency amplifier 32, high frequency amplification output switching circuits 29 to 31, UHF, VHF HIGH BAND and VHF LOW BAND high frequency amplification output tuning circuits 5, 17 and 25, a UHF mixing circuit 6 and a VHF mixing circuit 28, UHF, VHF HIGH BAND and VHF LOW BAND oscillating circuits 7, 13 and 8, a PLL channel selection circuit 27, IF amplifying circuits 19 and 21, an SAW filter 20 and an IF output terminal 12.

Figure 11:
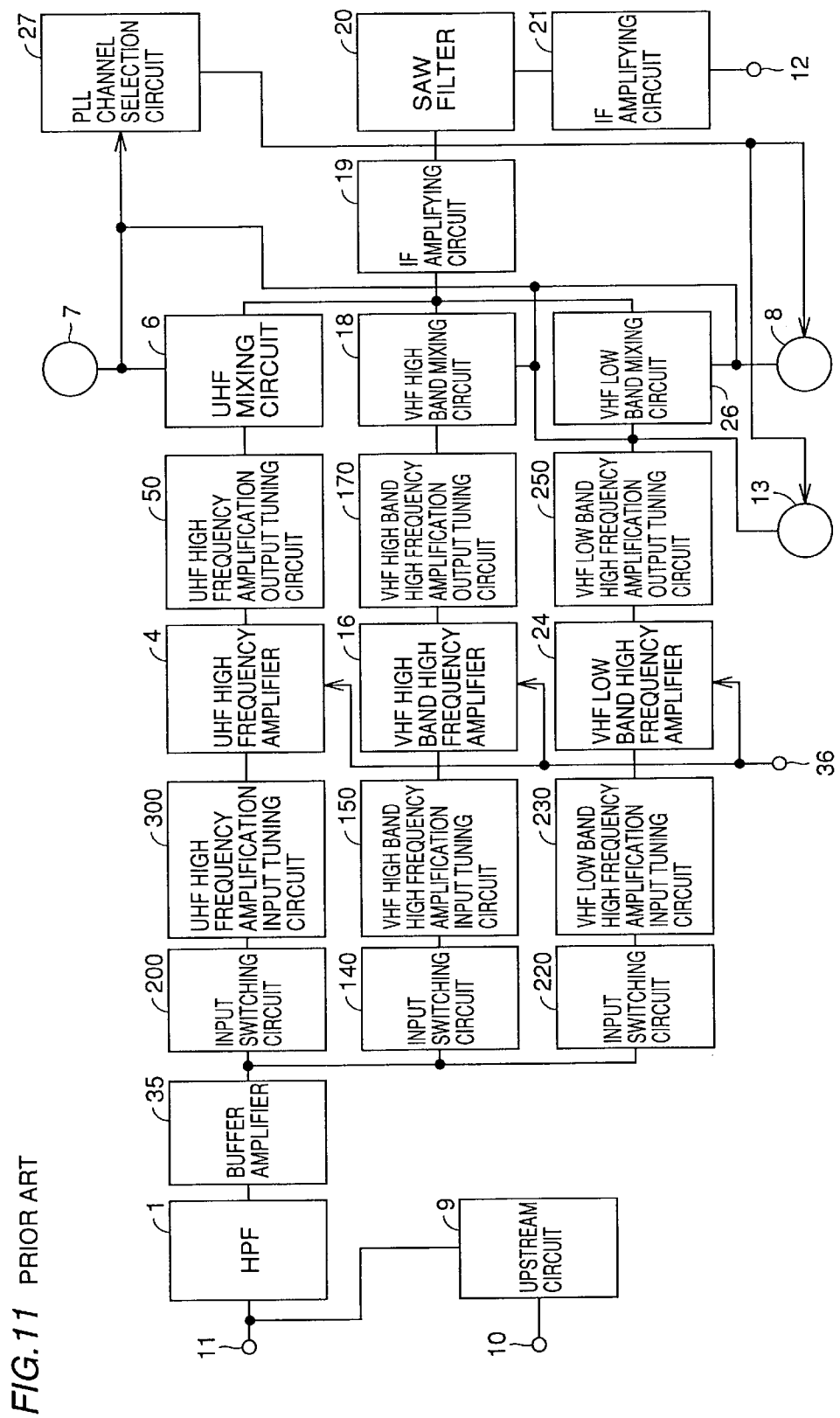
FIG. 11 is a block diagram of a conventional cable modem tuner.
Figure 12:
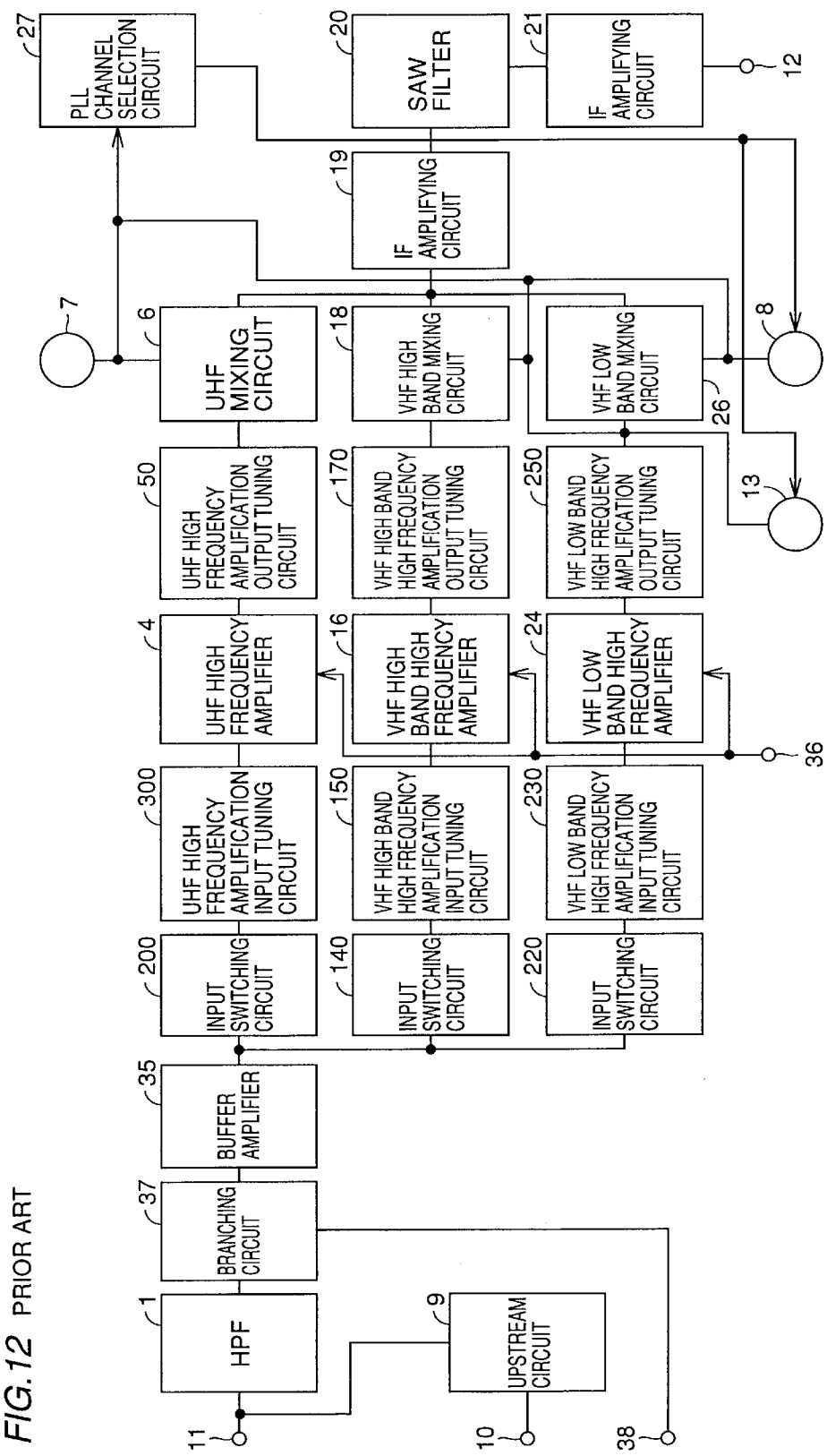
FIG. 12 is a block diagram of the conventional STB.

The configuration of FIG. 1 differs from the conventional configuration shown in FIG. 11 in that between HPF 1 and buffer amplifier 35, PIN attenuator circuit 33 is provided; the conventional three high frequency amplifiers 4, 16 and 24 are replaced by one high frequency amplifier 32; input switching circuits 300, 150 and 234 are replaced by input switching circuits 2, 14 and 22 as well as high frequency amplification input tuning circuits 3, 15 and 23; high frequency amplification output tuning circuits 50, 170 and 250 are replaced by high frequency amplification output tuning circuits 5, 17 and 25; and mixing circuits 6, 18 and 26 are reduced to mixing circuits 6 and 28. Except these points, the configuration shown in FIG. 1 is the same as that of FIG. 11, and detailed description thereof will not be repeated.

Referring to FIG. 1, the amount of attenuation of PIN attenuator circuit 33 is determined by the control of AGC driver 34. AGC driver 34 controls the PIN attenuator circuit 33 such that the circuit operates with the amount of attenuation in accordance with the AGC voltage supplied from AGC terminal 36.

Figure 2:
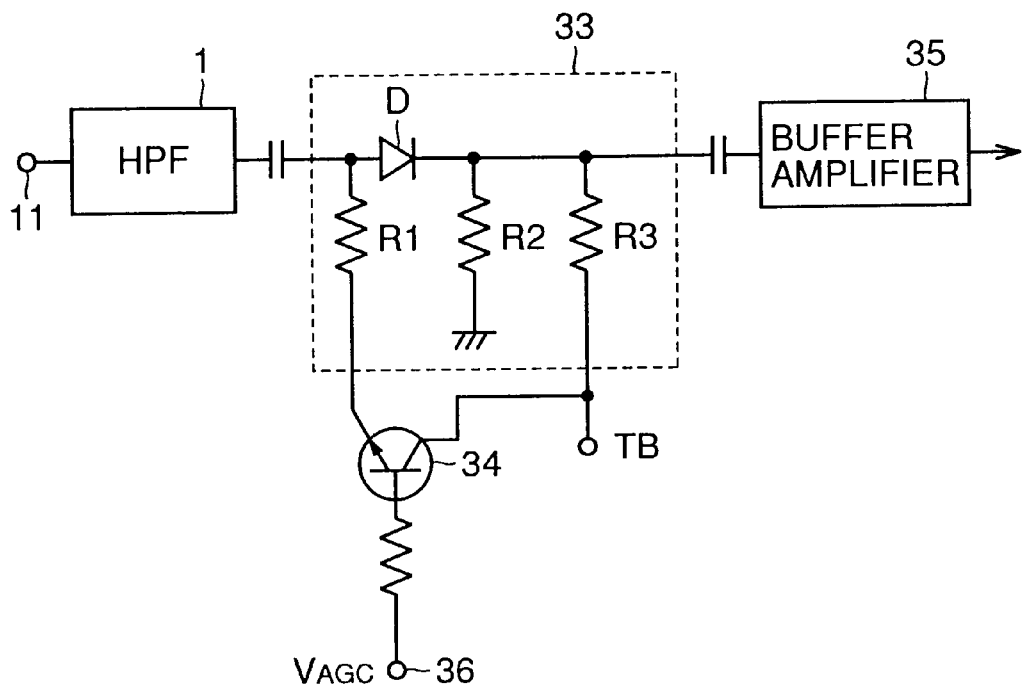
FIG. 2 represents a specific circuit configuration including a PIN attenuator circuit, an AGC driver and an AGC terminal of FIG. 1.

FIG. 2 represents a specific example of circuit configuration of PIN attenuator circuit 33, AGC driver 34 and AGC terminal 36.

Though various configurations have been proposed for PIN attenuator circuit 33 in general, here, one including a PIN diode D shown in FIG. 2 is used as a simple example of the circuit. More specifically, the AGC voltage $V_{AGC}$ applied to AGC terminal 36 is applied through AGC driver 34 and a resistor R1 to PIN diode D, so that PIN diode D turns on, and the current flows through a resistor R2 from HPF1 to buffer amplifier 35. As PIN diode D is a device which has a resistance value as a function of the current, the diode D comes to represent resistance when the level of the AGC voltage $V_{AGC}$ is lowered. As a result, the input signal level from the HPF1 (received signal level) is attenuated by the amount of attenuation in accordance with the level of the AGC voltage $V_{AGC}$ in PIN attenuator circuit 33 and applied to buffer amplifier 35. The AGC voltage $V_{AGC}$ is an input signal for the high frequency amplifier 32 of the succeeding stage, and variably set based on the signal level to be applied to the gate of the dual gate type MOSFET used here.

When multiwave signals as CATV signals of the same level are input (received) at the input terminal 11 simultaneously, the signal level applied to the gate of the dual gate type MOSFET used in the high frequency amplifier 32 of the succeeding stage attains to the high level of 60 dB$\mu$ or higher, resulting in intermodulation distortion or mixed modulation distortion at the time of signal transmission in the cable modem tuner. In the configuration of FIG. 1, however, because of the attenuation attained by the PIN attenuator circuit 33 in accordance with the level of the AGC voltage $V_{AGC}$, signal input at the high level to the high frequency amplifier 32 can be avoided. Therefore, such transmission distortion can effectively be improved.

Further, in order to reduce current consumption in buffer circuit 35, the AGC operation is attained not by the high frequency amplifier of the prior art but by the PIN attenuator circuit 33 as the AGC circuit using the PIN diode D in a stage preceding the buffer amplifier 35 or by an equivalent circuit. Thus, it becomes possible to operate the high frequency amplifier 32 with the multi signal input level of not higher than 0 dBmv. Accordingly, satisfactory distortion characteristic can be obtained without the necessity of causing large current flow through the device of the high frequency amplifier 32.

Thus, the configuration of FIG. 1 attains the effect of improving transmission distortion of the cable modem tuner by 1 to 3 dB. Particularly, improvement in transmission distortion is remarkable in relatively low reception frequency band of VHF LOW BAND.

Figure 3:
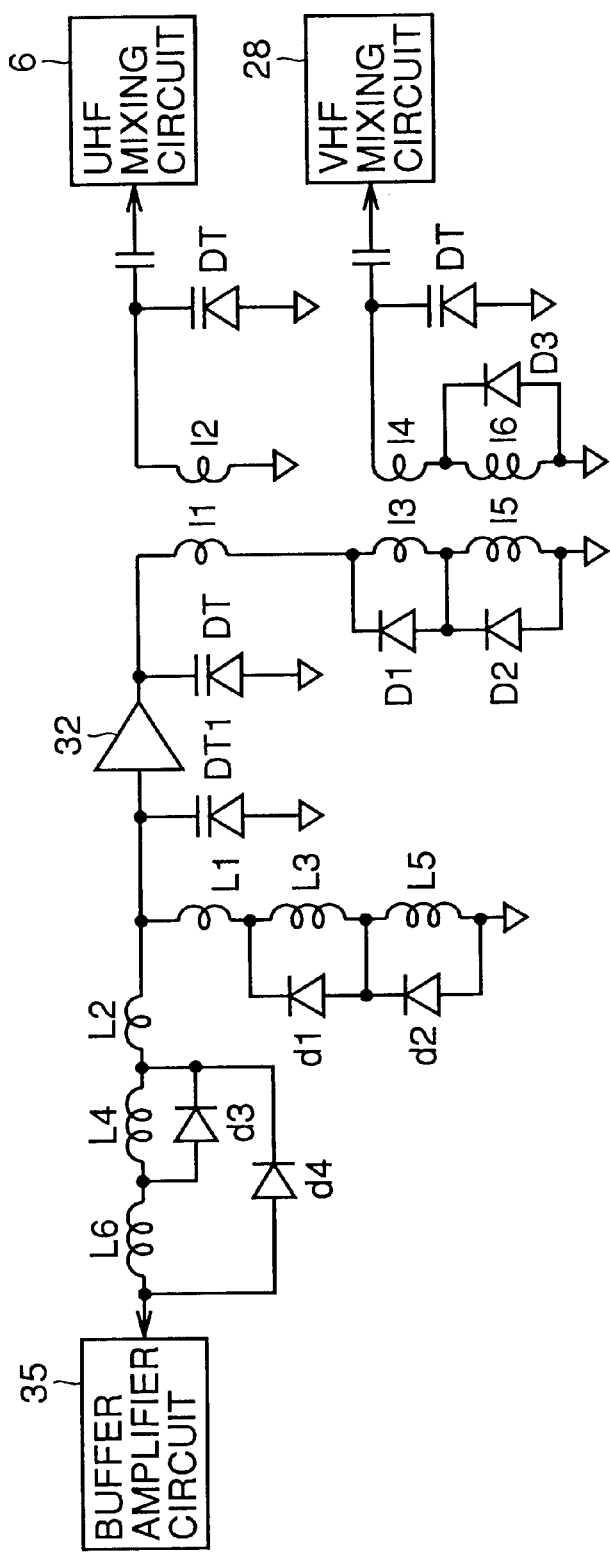
FIG. 3 represents a circuit configuration for band switching related to the high frequency amplifier shown in FIG. 2.

FIG. 3 shows a circuit configuration for band switching related to the high frequency amplifier 32 applied in FIG. 1.

In FIG. 1, switching of input signals to respective bands is realized by the circuit of FIG. 3, which utilizes switching of inductors by SW (switching) diodes, as three high frequency amplifiers 4, 16 and 24 of FIG. 11 are reduced to one high frequency amplifier 32. Accordingly, as compared with FIG. 11, in the configuration of FIG. 1, the high frequency amplifier can be reduced to one, and the band switching is realized by inductor switching utilizing SW diodes.

Accordingly, the number of circuit components constituting the cable modem tuner can be reduced. Specifically, the number of circuit components can be reduced by 5 to 10% as compared with the configuration of FIG. 11.

In FIG. 3, input switching circuits 2, 14 and 22 correspond to a circuit configuration for switching inductors L1 to L6 by the ON/OFF operations of diodes d1 to d4.

UHF high frequency amplification input tuning circuit 3 includes a variable capacitance diode DT1 and inductors L1 and L2; VHF HIGH BAND high frequency amplification input tuning circuit 15 includes variable capacitance diode DT1 and inductors L1, L3 and L5; and VHF LOW BAND high frequency amplification input tuning circuit 23 includes a variable capacitance diode DT1 and inductors L1, L3 and L5 as well as inductors L2, L4 and L6.

Similarly, high frequency amplification output switching circuits 29, 30 and 31 correspond to the circuit configuration for switching inductors 11 to 16 by the ON/OFF operations of SW diodes D1 to D3.

UHF high frequency amplification output tuning circuit 5 includes a variable capacitance diode DT and inductors 11 and 12. VHF HIGH BAND high frequency amplification output tuning circuit 17 includes a variable capacitance diode DT and inductors L1, L3 and L4. VHF LOW BAND high frequency amplification output tuning circuit 25 includes variable capacitance diode DT and inductors 11, 13 and 15 as well as 14 and 16.

Though the high frequency amplification input and output switching circuits are formed by a plurality of SW diodes and a plurality of inductors, only one of the switching circuits may be formed by a plurality of SW diodes and a plurality of inductors, and the other switching circuit may have the conventional configuration. Even in that case, the number of circuit components can be reduced and the power consumption can be suppressed.

In operation, the QPSK modulated data signal as the up signal is transmitted through a upstream circuit 9 to a cable, not shown, connected to input terminal 11.

On the other hand, the down signal from the cable passes through HPF1, attenuated by a prescribed level at PIN attenuator circuit, and the reception band (54 to 860 MHz) is amplified by buffer amplifier 35. Thereafter, the signal enters input switching circuits 2, 14 and 22 and switched to respective circuits of B1 to B3 bands.

As shown in FIG. 3, switching of the input switching circuits 2, 14 and 22 is attained by SW diodes.

The bands are adapted such that in accordance with the received channel, the corresponding band is set to an operable state and other bands are kept inoperable.

For example, when a signal of the UHF BAND channel is received, circuits 1 to 3, 5 to 7, 9, 19, 21, 27, 29 and 32 to 35 are set to the operable states, and operations of circuits 8, 13 to 15, 17, 22 and 23, 25, 28 and 30 to 31 are stopped. Similarly, when a signal of the VHF HIGH BAND is received, circuits 1, 9, 13 to 15, 17, 19 to 21, 27 and 28, 30 and 32 to 35 are set to the operable state, and operations of circuits 2, 3, 5 to 8, 22 and 23, 25, 29 and 31 are stopped. When a signal of the VHF LOW BAND is received, circuits 1, 8 and 9, 19 to 23, 25, 27 and 28, 31 and 33 to 35 are set to the operable state, and operations of the circuits 2 and 3, 5 to 7, 13 to 15, 17 and 30 are stepped. These operations are attained under the control of function switching operation similar to the prior art, with the channel selection data applied from the CPU, not shown, to PLL channel selection circuit 27.

The state of operation of each band will be described in the following. The CATV signal passes through HPF1, PIN attenuator circuit 33 and buffer amplifier 35, enters input switching circuits 2, 14 and 22 where band switching is performed, and channel selection is done in each of high frequency amplification input tuning circuits 3, 15 and 23.

Then, after amplification by high frequency amplifier 32, band switching is performed by high frequency amplification output switching circuits 29, 30 and 31, and the received signals are provided at high frequency amplification output tuning circuits 5, 17 and 25, respectively.

The signal provided by the high frequency amplifying circuit has its frequency converted by mixing circuits 6 and 28 and local oscillating circuits 7, 8 and 13, applied to intermediate frequency amplifying circuit 19, amplified and passed to SAW filter 20, and thereafter, again amplified by IF amplifying circuit 21 and externally output through IF output terminal 12. These operations are common to respective bands.

As described above, in the cable modem tuner shown in FIG. 1, the number of circuit elements constituting the high frequency amplifier is reduced from the conventional three to one, and the configuration of the related switching circuit is very much simplified to switching of inductors using SW diodes. Accordingly, power consumption in the high frequency amplifier can be reduced, and current consumption at the switching circuit can also be reduced.

Further, as the PIN attenuator circuit 33 for the AGC circuit including the PIN diode D is positioned on the side of the signal input side, with the buffer amplifier 35 and the high frequency amplifier 32 provided in the succeeding stages, the intermodulation distortion and mixed modulation distortion in the received signal can be improved, without sacrificing the conventional functions.

More specifically, as the PIN attenuator circuit 33 operates in the preceding stage of buffer amplifier 35, the tolerant input level for the input signal (received signal) can be improved as compared with the prior art. More specifically, when multiwave signals as the CATV signal (130 CW (Carrier Wave) signal) are received and input at the level of +10 to +15 dBmV, the intermodulation distortion and the mixed modulation would be −40 to −50 dBc or more if the PIN attenuator circuit 33 is not provided preceding the buffer amplifier 35, while the intermodulation distortion and mixed modulation distortion would be −55 dBc to −60 dBc or more in the configuration having the PIN attenuator circuit 33. Thus, the distortion can sufficiently be reduced for the received signal, improving the tolerant input level of the input signal.

Figure 4:
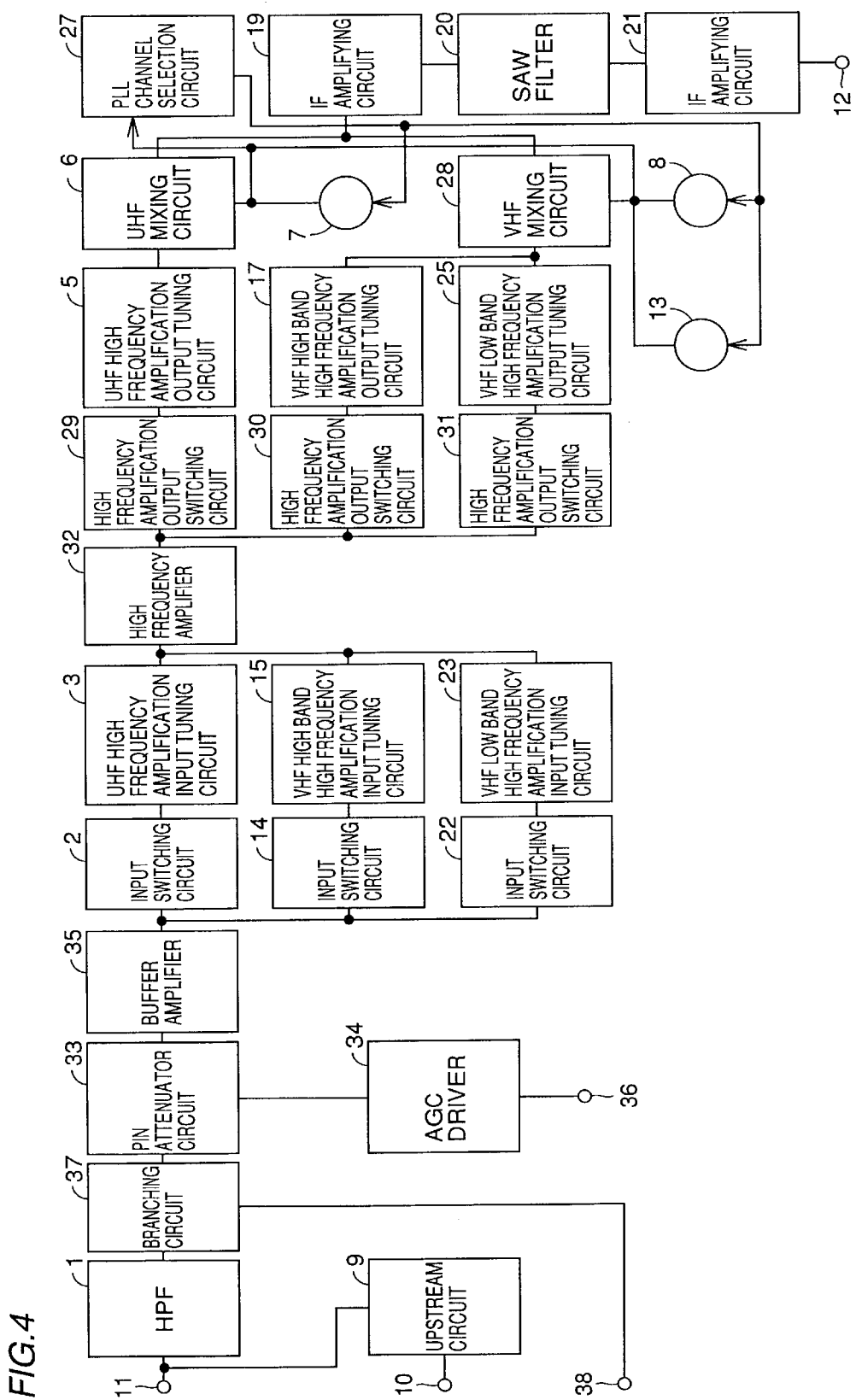
FIG. 4 is a block diagram of the STB representing another embodiment of the present invention.

FIG. 4 shows an example of the present invention applied to the STB. Referring to FIG. 4, a branching circuit 37 is provided between HPF1 and PIN attenuator circuit 33 shown in FIG. 1. By the branching circuit 37, the down data signal is branched and output to OBB terminal 38. Except this point, the configuration is the same as that of FIG. 1.

Therefore, in the STB shown in FIG. 4 also, by the attenuation attained by the PIN attenuator circuit 33 in accordance with the level of AGC voltage $V_{AGC}$, signal input at the high level to high frequency amplifier 32 can be avoided, and hence the transmission distortions can effectively be improved. Further, by the operation of PIN attenuator circuit 33, it becomes possible to operate the high frequency amplifier 32 with the input level of multiwave signal being not higher than 0 dBmv. Therefore, even when a large amount of current flows through the elements of high frequency amplifier 32, satisfactory distortion characteristic can be ensured.

Figure 5:
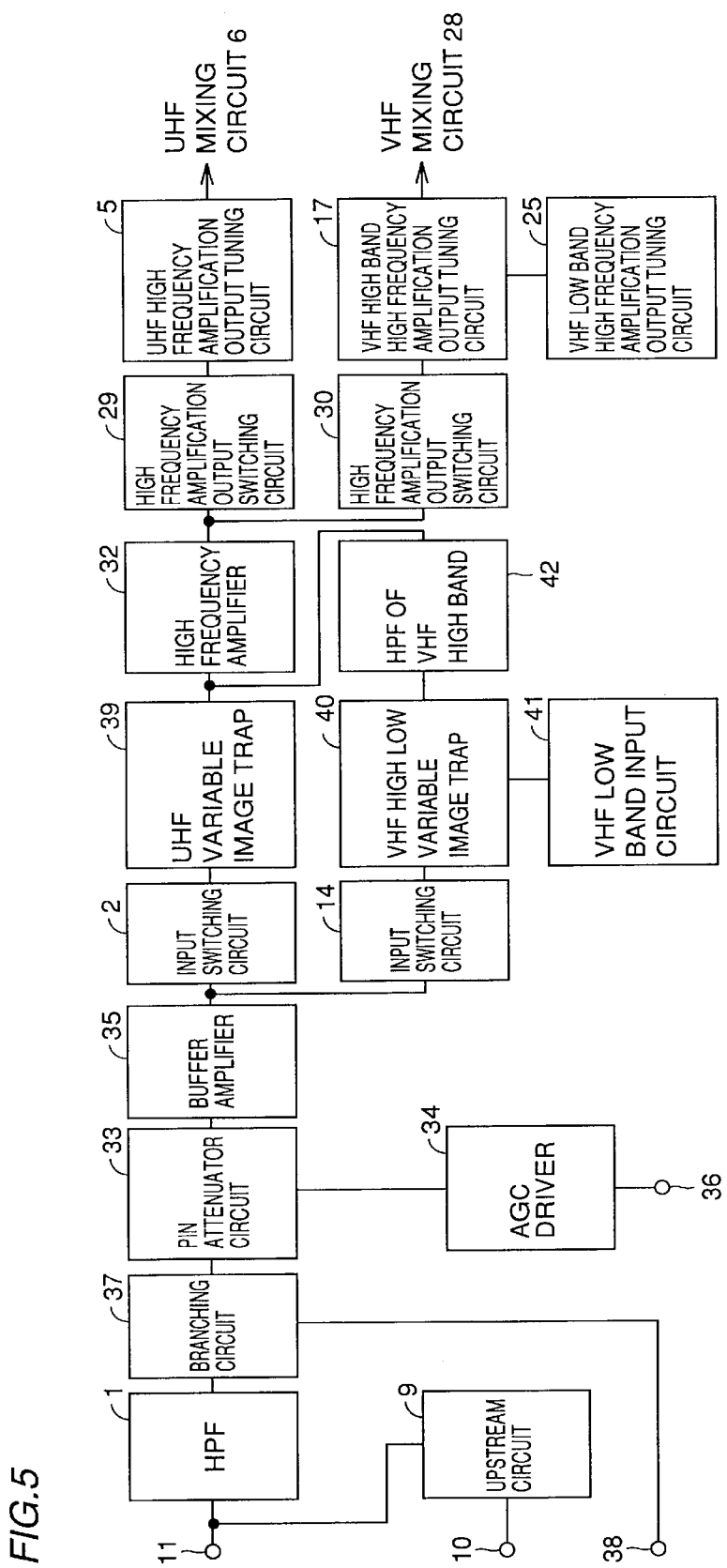
FIG. 5 is a block diagram of the STB representing another embodiment of the present invention.
Figure 6:
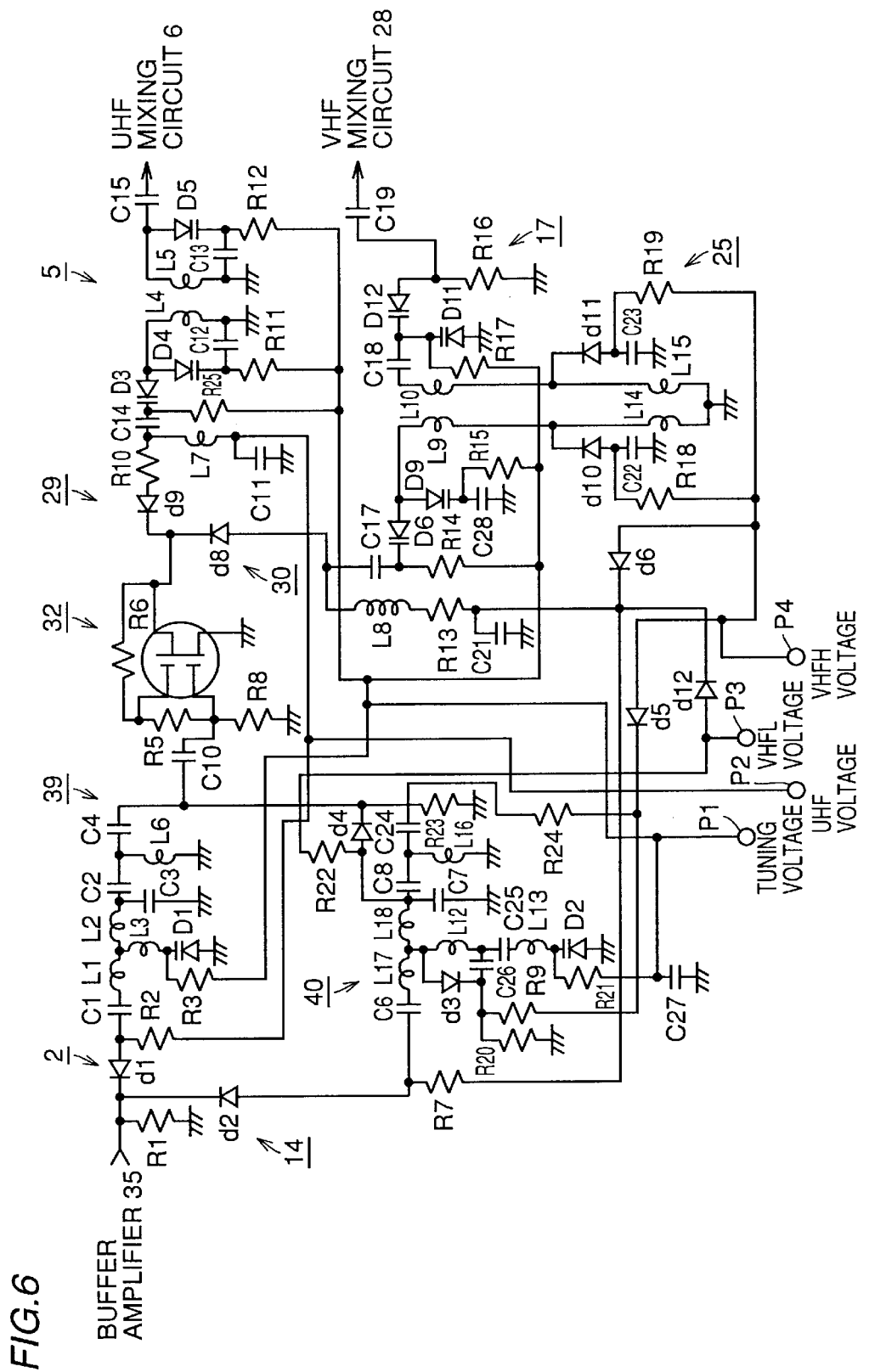
FIG. 6 is a specific circuit diagram of main components of the STB shown in FIG. 5.

FIG. 5 is a schematic block diagram of the STB in accordance with another embodiment of the present invention, and FIG. 6 is a specific circuit diagram of the main portions of FIG. 5.

In the embodiments shown in FIGS. 1 and 4, tuning is performed in each of UHF, VHF High and VHF Low bands, amplification is done by one high frequency amplifier 32, and tuning circuits are provided for respective bands also on the output side. By contrast, in the embodiment shown in FIGS. 5 and 6, the signals of UHF, VHF High and VHF Low bands are extracted by using a variable band filter and high frequency amplification is performed.

More specifically, in FIG. 5, HPF1, upstream circuit 9, branching circuit 37, PIN attenuator circuit 33, AGC driver 34 and buffer amplifier 35 have the same configurations as those shown in FIG. 4, and configurations following UHF mixed circuit 6 and UHF mixed circuit 28 are not shown. Input switching circuit 2 switches inputs to UHF variable image trap circuit 39 and to a VHF HIGH, LOW variable image trap 40. UHF variable image trap circuit 39 traps a frequency outside 470 MHz to 860 MHz of the UHF band. VHF HIGH, LOW variable image trap 40 traps a frequency outside 170 MHz to 470 MHz of the High band and out of 54 MHz to 170 MHz of the VHF Low band. Therefore, the VHF HIGH, LOW variable image trap 40 extracts a signal within the band of 54 MHz to 470 MHz. Of the extracted signal, VHF HIGH BAND HPF42 extracts a signal within the band of 170 MHz to 470 MHz and applies the extracted signal to high frequency amplifier 32. When the VHF Low band is selected by the VHF LOW BAND input circuit 41, VHF HIGH, LOW variable image trap 40 extracts a received signal of VHF Low band within the band of 54 MHz to 170 MHz.

FIG. 6 shows specific circuit configuration following input switching circuits 2 to 14, where switching diodes d1 to d6 constitute the input switching circuits 2 and 14 of FIG. 5. UHF variable image trap circuit 39 selecting the UHF band is constituted by an image trap variable capacitance diode D1, coils L1 to L3 and L6 as well as capacitors C1 to C4. Coil L1 is for matching, coil L3 is for UHF image trapping, coil L2 and capacitor C3 constitute an LPF of UHF band, and capacitors C2 and C4 together with coil L6 constitute an HPF of the UHF band. Capacitors C1 and C2 are capacitors for preventing DC current, resistor R3 is a bias resistance of variable capacitance diode D1, and resistors R1 and R2 are bias resistances of switching diodes d2 and d1.

VHF HIGH, LOW variable image trap circuit 40 selecting the VHF High band and VHF Low band includes an image trap variable capacitance diode D2, coils L13, L17, L18, a capacitor C7 and switching diodes d3 and d4. VHF Low band is selected by image trap variable capacitance diode D2, coils L12, L16 to L8 and capacitors C7, C8 and C24.

Here, the coil L13 is for VHF High band image trapping, the coil L12 is for VHF Low band image trapping, coil L17 is for matching, coil L18 and capacitor C7 provide an LPF for VHF High band, and capacitors C24 and C8 together with coil L16 constitute a VHF HIGH BAND HPF42. Capacitors C6, C10, C25 and C26 represent DC current preventing capacitors, capacitor C27 is a bypass capacitor, and resistor R21 is a bias resistance of variable capacitance diode D2.

High frequency amplification output switching circuit 29 shown in FIG. 5 includes switching diode d9 shown in FIG. 6, and high frequency amplification output switching circuit 30 includes switching diode d10. UHF high frequency amplification output tuning circuit 5 is provided by a double-tuned circuit including variable capacitance diodes D4 and D5, coils L4 and L5 and capacitors C12 and C13.

Further, VHF HIGH BAND high frequency amplification output tuning circuit 17 of FIG. 5 is formed by a double-tuned circuit of VHF High band including variable capacitance diodes D9 and D 11, coils L9 and L11 and capacitors C17 and C18 shown in FIG. 6, and VHF LOW high frequency amplification output tuning circuit 25 is provided by a double-tuned circuit of VHF Low band including variable capacitance diodes D9 and D11, coils L9, L10, L14 and L15 and capacitors C22 and C23.

Coils L7 and L8 are high frequency choke coils, capacitor C15 is a coupling capacitor, capacitors C14, C17 and C19 are capacitors for preventing DC current, capacitors C11, C21, C22 and C23 are bypass capacitors, resistors R10 and R13 are dumping resistances, and resistors R11, R12, R14, R15, R16 and R17 are bias resistances of variable capacitance diodes D3, D4, D5, D6, D9, D11 and D12.

A tuning voltage is applied to power supply terminal P1, a selecting voltage of UHF band is applied to power supply terminal P2, a selecting voltage of VHF Low band is applied to power supply terminal P3, and a selecting voltage of VHF High band is applied to power supply terminal P4. These applications are realized by the following operation: final selecting data is transmitted from the CPU, not shown, to PLL channel selection circuit 27 shown in FIG. 1, channel selection is performed based on the data and, simultaneously, input switching circuit of band switching operates in accordance with the band characteristic so that the selecting voltages for respective bands are switched.

The state of operation of each band of FIGS. 5 and 6 will be described in the following. The CATV signal is supplied through HPF1, branching circuit 37 and PIN attenuator circuit 33 to buffer circuit 35 in the similar manner as in FIGS. 1 and 4. In PIN attenuator circuit 33, the amount of attenuation of PIN attenuator circuit 33 is controlled by AGC driver 34, based on the AGC voltage $V_{AGC}$ applied to AGC terminal 36.

The output of buffer amplifier 35 has its band switched by switching diodes d1 to d6 included in input switching circuit 2. When a selecting voltage of UHF band is applied to power supply terminal P2, switching diodes D1 and D9 are rendered conductive, and the UHF band of 470 MHz to 860 MHz is selected by the LPF consisting of coil L2 and capacitor C3 and the HPF consisting of capacitors C2 and C4 and coil L6. The signal of this band is subjected to high frequency amplification by high frequency amplifier 32, and applied to high frequency amplification output switching circuit 29. The switching diode d9 of high frequency amplification output switching circuit 29 has been rendered conductive by the selecting voltage of UHF band, so that the signal is tuned by the double-tuned circuit including variable capacitance diodes D4, D5, coils L4 and L5 and capacitors C12 and C13 of UHF high frequency amplification output tuning circuit 5, and a received signal is output to UHF mixing circuit 6.

When a selecting voltage of VHF High band is applied to power supply terminal P4, switching diodes d5, d3, d2 and d4 are rendered conductive, and by the LPF consisting of coil L18 and capacitor C7 and the HFP consisting of capacitors C8 and C24 and coil L16 in VHF HIGH, LOW variable image trap 40, the band of 170 MHz to 470 MHz is selected, and amplified by high frequency amplifier 32. The switching diode d8 of high frequency amplification output switching circuit 30 has been rendered conductive by the selecting voltage of VHF High band, and therefore the signal is tuned by the double-tuned circuit including variable capacitance diodes D9 and D11, coils L9 and L10 and capacitors C17 and C18 included in VHF HIGH BAND high frequency amplification output tuning circuit 17, and the received signal is output to VHF mixing circuit 28. At this time, switching diodes d10 and d11 are rendered conductive, while coils L14 and L15 are short-circuited.

When the selecting voltage of VHF Low band is applied to power supply terminal P3, switching diode d4 included in VHF LOW BAND input circuit 41 is rendered conductive, the HPF including capacitors C8 and C24 and coil L16 is short-circuited, and by the LPF consisting of coil L18 and capacitor C7, the VHF Low band of 54 MHz to 170 MHz is selected. Further, by the VHF Low band selecting voltage, switching diodes d12 and d16 are rendered conductive, and the signal is tuned by the double-tuned circuit including variable capacitance diodes D9 and D12, coils L9 and L10 included in VHF HIGH BAND high frequency amplification output tuning circuit 17 and coils L14 and L15 included in VHF LOW BAND high frequency amplification output tuning circuit 25, and the received signal is output to VHF mixing circuit 28.

As the operation after the signal is passed through UHF mixing circuit 6 and VHF mixing circuit 28 is the same as that of FIG. 1, detailed description thereof will not be repeated.

As described above, in the embodiment shown in FIGS. 5 and 6, it is possible to extract the signal of UHF band, VHF High band or VHF Low band by using the variable band filter, and high frequency-amplified by the high frequency amplifier 2, so that the circuit configuration can be simplified and the power consumption can be reduced.

Figure 7:
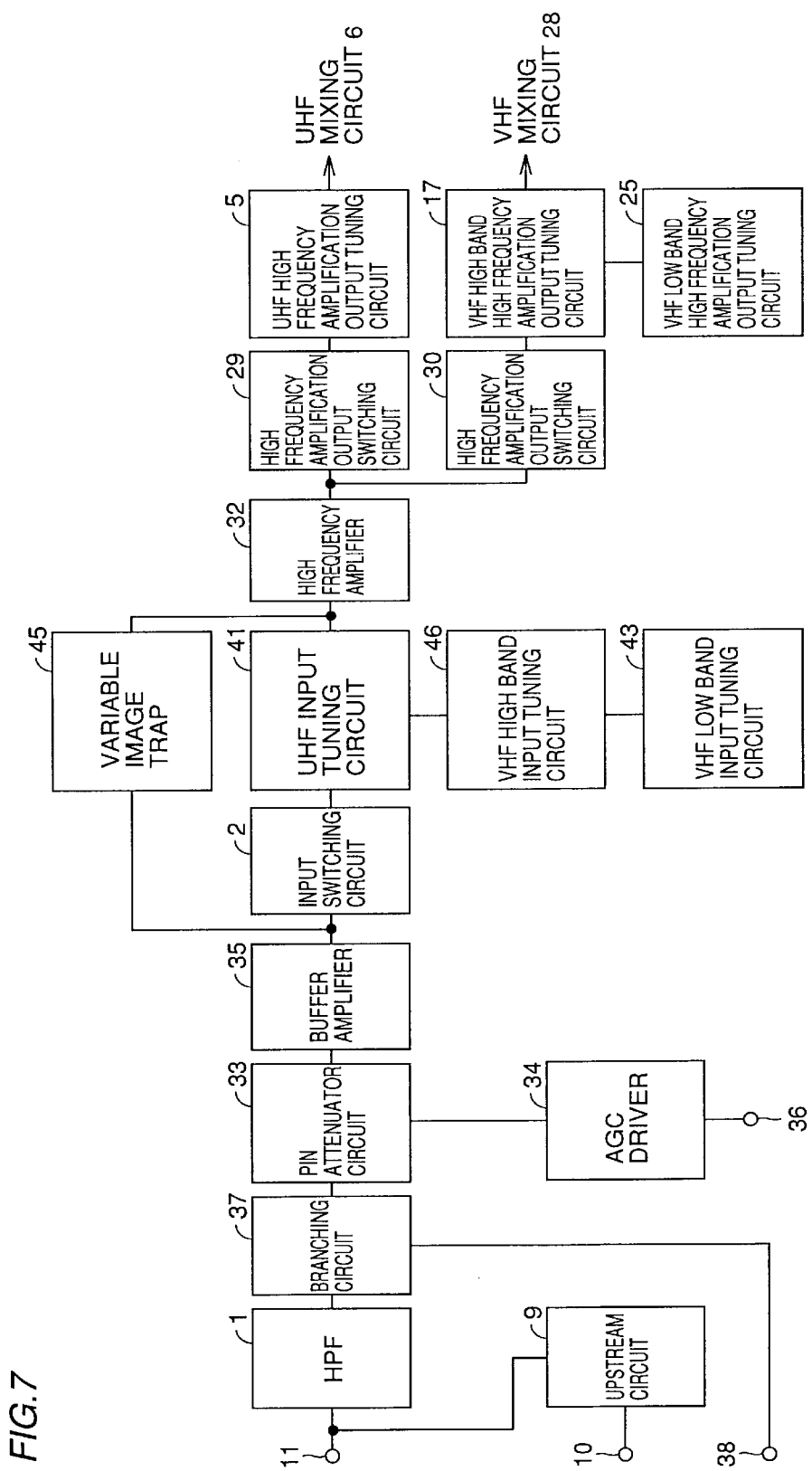
FIG. 7 is a block diagram of the STB representing a still further embodiment of the present invention.
Figure 8:
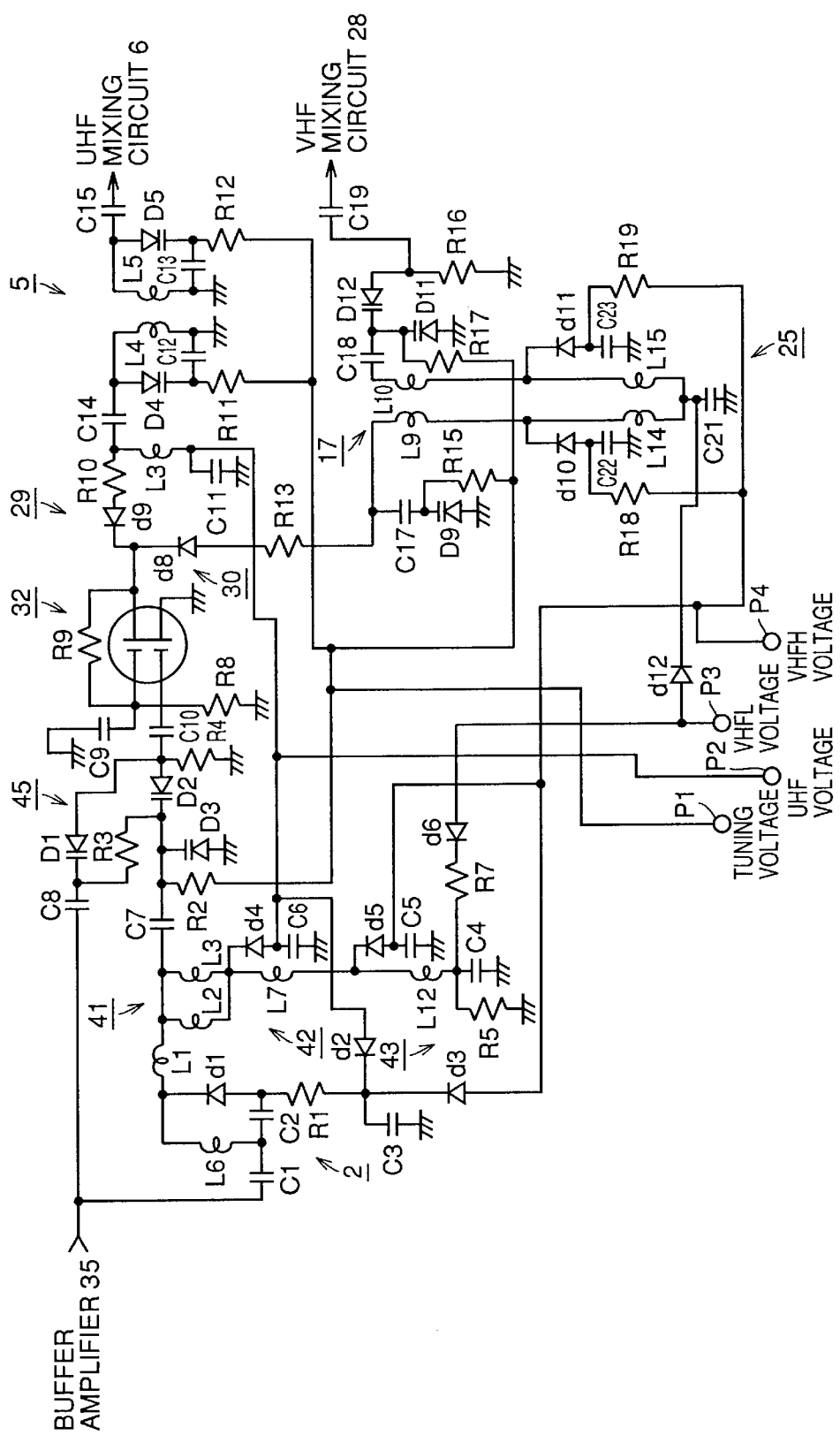
FIG. 8 is a specific circuit diagram of main components shown in FIG. 7.

FIG. 7 is a schematic block diagram of another embodiment of the present invention, and FIG. 8 is a specific circuit diagram of main portions of FIG. 7.

The embodiment of FIGS. 7 and 8 is the same in configuration as the embodiment of FIGS. 5 and 6 except that the input switching circuit 14 of FIGS. 5 and 6 is removed, and that in place of UHF variable image trap 39 and VHF HIGH, LOW variable image trap circuit 40, a UHF input tuning circuit 41, a VHF HIGH BAND input tuning circuit 46 and a VHF LOW BAND input tuning circuit 43 are provided.

Input switching circuit 2 includes switching diodes d1 to d6, rendered conductive in accordance with the UHF band selecting voltage, VHF Low band selecting voltage and VHF High band selecting voltage applied to power supply terminals P2 to P4, and the UHF band, VHF High band and VHF Low band are switched. UHF input tuning circuit 41 includes variable capacitance diode D3, coils L2 and L3, capacitor C6 and switching diode d4, for tuning to the UHF band.

VHF HIGH BAND input tuning circuit 46 includes variable capacitance diode D3, coils L2, L3 and L7, capacitors C7 and C5 and a switching diode d5 for tuning to the VHF High band. VHF LOW BAND input tuning circuit 43 includes variable capacitance diode D3, and coils L2, L3, L7 and L12 for tuning to VHF Low band.

In FIG. 8, D1 is a variable capacitance diode for image trapping and D2 is a variable diode for matching, which constitute the variable image trap circuit 45 of FIG. 7. Coil L1 is a matching coil for UHF, VHF High band, coil L6 is for matching VHF Low band and L3 is a choke coil. Capacitors Cl, C2 and C10 are for preventing DC current, capacitors C3, C4, C5, C6 and C9 are bypass capacitors, and capacitor C8 is a coupling capacitor. Resistors R1, R5 and R7 are bias resistances of switching diodes, resistors R2, R3 and R4 are bias resistances of variable capacitance diodes, and resistors R8 and R9 are gate bias resistances for the high frequency amplifier.

When the UHF tuning voltage is applied to power supply terminal P2, switching diode d4 is rendered conductive, the signal is tuned to the UHF band by the tuning circuit including variable capacitance diode D3, coils L2 and L3 and capacitor C6, and the received signal is applied to high frequency amplifier 32 for high frequency amplification.

When the VHF High band selecting voltage is applied to power supply terminal P4, switching diodes d3 and d5 are rendered conductive, and the signal is tuned to VHF High band by the tuning circuit including variable capacitance diode D3, coils L2, L3 and L7 and capacitor C5, and the received signal is applied to high frequency amplifier 32 for high frequency amplification.

When the VHF Low band selecting voltage is applied to power supply terminal P3, switching diode d6 is rendered conductive, the signal is tuned to VHF Low band by the tuning circuit including variable capacitance diodes D3 and coils L2, L3, L7 and L12, and a received signal is applied to high frequency amplifier 32 for high frequency amplification. Except these points, the operation is the same as the embodiment of FIGS. 5 and 6. Therefore, by this embodiment also, the circuit configuration can be simplified and the power consumption can be reduced.

Figure 9:
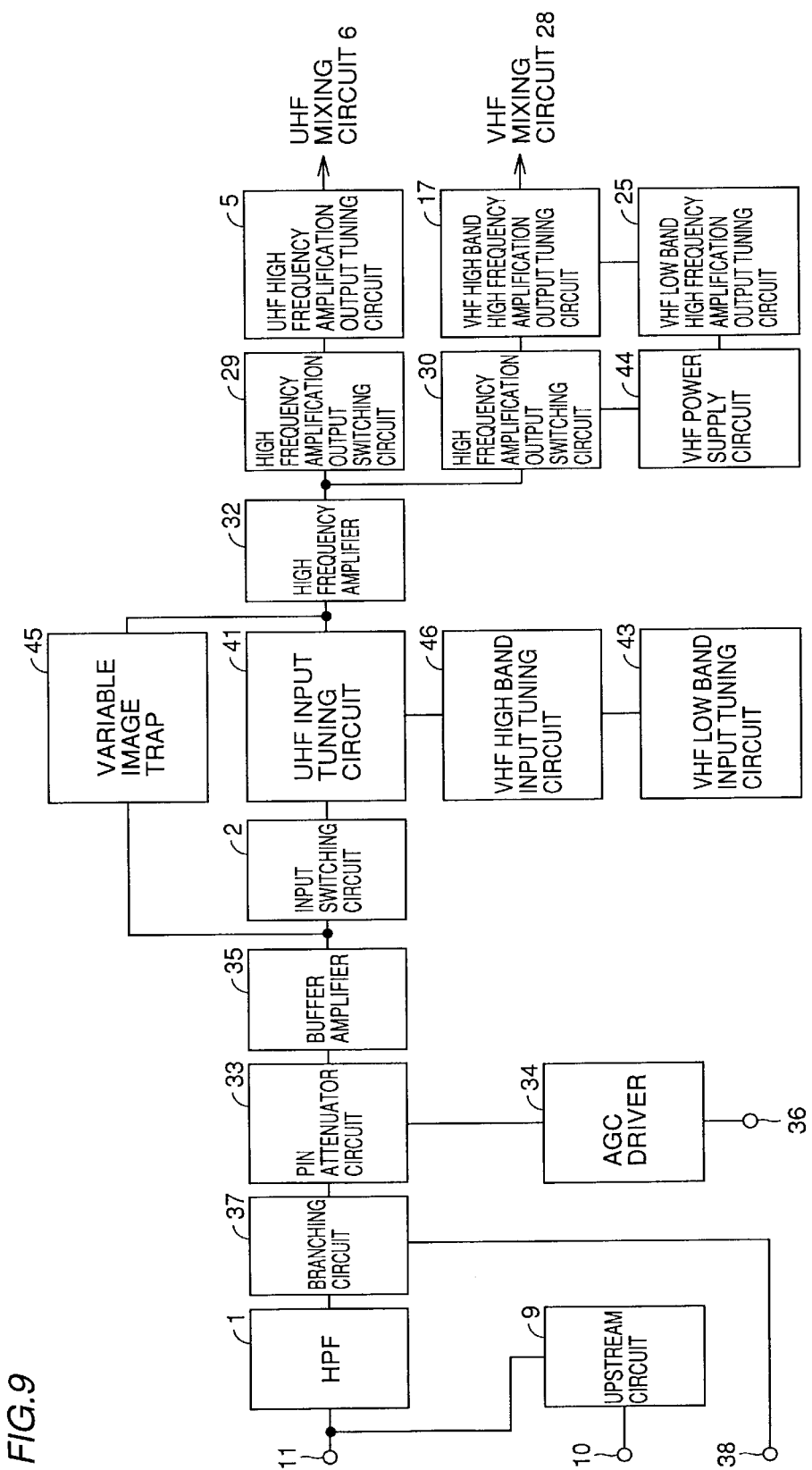
FIG. 9 is a block diagram of the STB representing a still further embodiment of the present invention.
Figure 10:
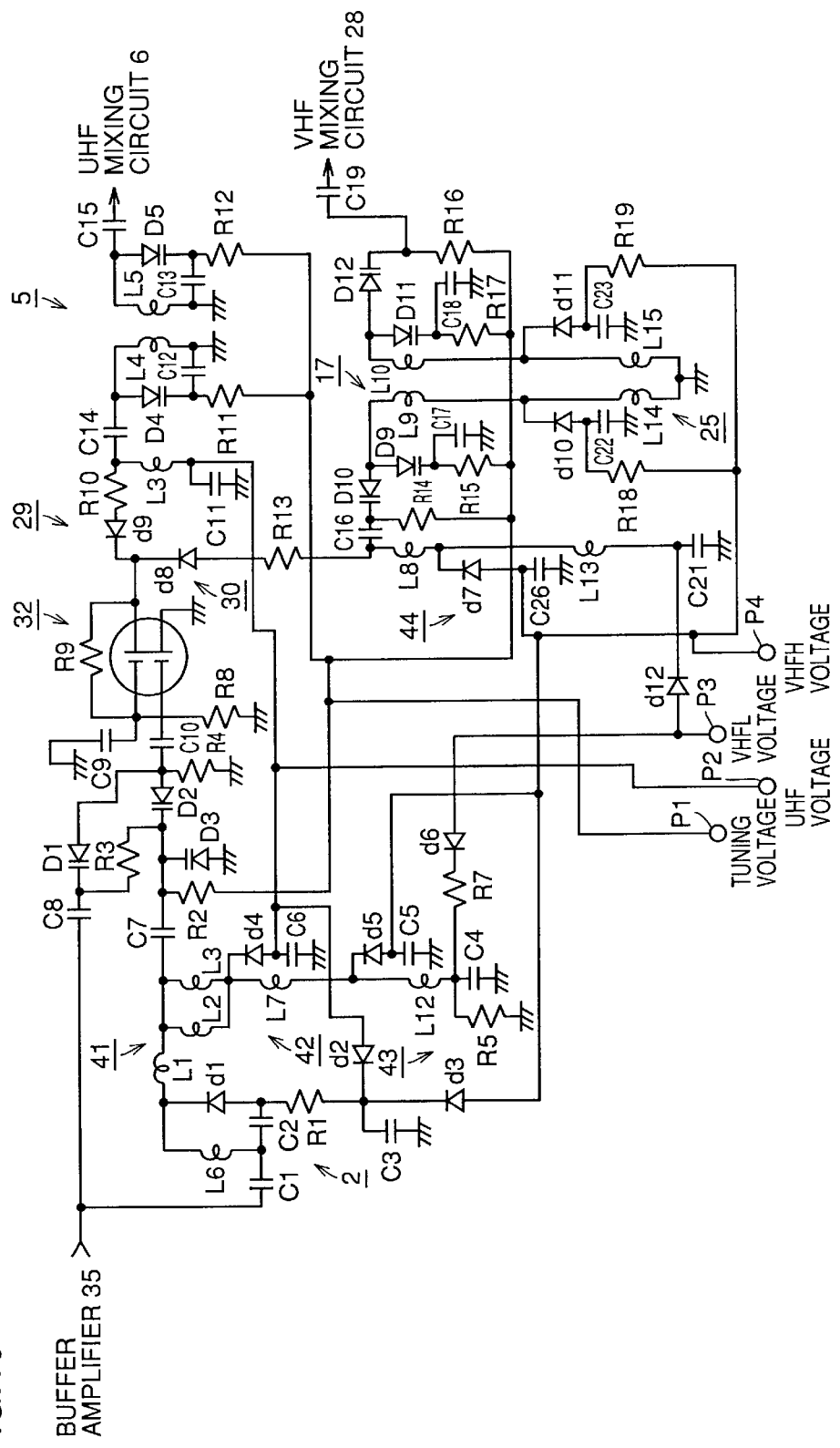
FIG. 10 is a specific circuit diagram representing a main circuit configuration of FIG. 9.

FIG. 9 is a block diagram showing a still further embodiment of the present invention, and FIG. 10 is a specific circuit diagram of the main portions of FIG. 9. The embodiment shown in FIGS. 9 and 10 includes a VHF power supply circuit 44 newly provided. Except this point, the embodiment has the same configuration as that of FIGS. 7 and 8. The VHF power supply circuit 44 includes a circuit supplying the VHF High band selecting voltage to VHF High, Low band selecting switching diode d8 through switching diode d7, coil L8 and a resister R13, and a circuit for supplying the VHF Low band selecting voltage to switching diode d8 through coils L13 and L18 and resistor R13. The tuning circuit included in VHF HIGH BAND high frequency amplification output tuning circuit 17 includes variable capacitance diodes D9 and D11, coils L9, L10 and capacitors C17 and C18, and further includes matching variable capacitance diodes D10 and D12.

The embodiment is similar to the embodiment of FIGS. 7 and 8 except that when the VHF High band selecting voltage is applied to the power supply terminal P4, switching diode d8 is rendered conductive through switching diode d7, coil L8 and resistor R13. Therefore, by this embodiment also, the circuit configuration can be simplified and the power consumption can be reduced.

As described above, by the embodiments of the present invention, the signal is first attenuated by a prescribed gain at the gain controlling means at the down signal receiving unit, amplified, tuned to desired frequency in each range and amplified by high frequency amplifying unit, and for each range, signal is converted to the desired intermediate frequency signal by the frequency converting circuit. Therefore, the down signal is attenuated with a prescribed gain regardless of the amplification of high frequency amplifying unit in gain control unit. Therefore, even when the multiwave down signals are received at the high input level, signal distortion caused by the high level down signal entering the succeeding circuitry for amplification can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A CATV tuner comprising:

an upstream circuit for transmitting a data signal to a CATV (cable television) station, a high pass filter for receiving a multiwave down signal from said CATV station while removing said data signal, and a receiving unit for receiving the down signal provided through said high pass filter, wherein said receiving unit includes a gain control circuit receiving said down signal, attenuating the down signal with a prescribed gain and thereafter amplifying the down signal and outputting a resulting signal, a high frequency amplifying circuit receiving the output signal from said gain control circuit and extracting signals having frequencies of different ranges dependent on different frequency bands, a frequency converting circuit converting each of the signals from said high frequency amplifying circuit to a prescribed intermediate frequency signal of respective ranges, and an intermediate frequency amplifying circuit amplifying the output signals from said frequency converting circuit and providing an amplified output, wherein said high frequency amplifying circuit includes input selecting circuits for receiving an output signal from said gain control circuit and selectively providing outputs of a plurality of ranges dependent on frequency band, high frequency amplification input tuning circuits, corresponding to said plurality of ranges respectively, for tuning the signal of each range selected by said input selecting circuits to a desired frequency, and outputting resulting signals, a high frequency amplifying circuit provided commonly to said plurality of ranges, amplifying respective output signals from said high frequency amplification input tuning circuits and providing an amplified output, output selecting circuits receiving the output signal from said high frequency amplifying circuit and selectively providing outputs to said plurality of ranges, and high frequency amplification output tuning circuits provided corresponding to said plurality of ranges respectively, receiving the signals of respective ranges selectively output from said output selecting circuits, tuning the signals to desired frequencies, and providing an output.

2. The CATV tuner according to claim 1, wherein a down data of a frequency band different from that of said multiwave down signal is input from said CATV station through a cable to said receiving unit, and said receiving unit includes a branching circuit branching and outputting said down data signal.

3. The CATV tuner according to claim 2, wherein said high frequency amplifier includes a bipolar transistor.

4. The CATV tuner according to claim 2, wherein said high frequency amplifier includes a dual gate transistor.

5. The CATV tuner according to claim 1, wherein said input circuit includes an attenuating for circuit receiving said down signal as an input, for attenuating the down signal with said prescribed gain and for providing an output, and a buffer amplifying circuit for receiving an output signal from said attenuating circuit, for amplifying over broad-band and for outputting a resulting signal.

6. The CATV tuner according to claim 1, wherein said prescribed gain is variably set based on an input signal level at said high frequency amplifying unit.

7. A CATV tuner comprising:

an upstream circuit for transmitting a data signal to a CATV (cable television) station, a high pass filter for receiving a multiwave down signal from said CATV station while removing said data signal, and a receiving unit for receiving the down signal provided through said high pass filter, wherein said receiving unit includes a gain control circuit receiving said down signal, attenuating the down signal with a prescribed gain and thereafter amplifying the down signal and outputting a resulting signal, a high frequency amplifying circuit receiving the output signal from said gain control circuit and extracting signals having frequencies of different ranges dependent on different frequency bands, a frequency converting circuit converting each of the signals from said high frequency amplifying circuit to a prescribed intermediate frequency signal of respective ranges, and an intermediate frequency amplifying circuit amplifying the output signals from said frequency converting circuit and providing an amplified output, wherein said high frequency amplifying circuit includes input selecting circuits for receiving an output signal from said gain control circuit and for selectively providing outputs of a plurality of ranges dependent on frequency band, at least two high frequency filter circuits for receiving signals of at least two ranges selected by said input selecting circuit and for cutting off a frequency other than a desired frequency, a high frequency amplifier, provided commonly to the two ranges, for amplifying an output selectively provided from said high frequency filter circuits and outputting a resulting signal, an output selecting circuit for receiving an output signal from said high frequency amplifier and for selectively outputting a signal of either of said at least two ranges, and high frequency amplification output selecting circuits, provided for said at least two ranges respectively, for receiving the signals of the at least two ranges output from said output selecting circuit, for tuning each of the signals to a desired frequency of respective range, and for outputting a resulting signal.

8. The CATV tuner according to claim 7, wherein at least one of said input selecting circuit and said output selecting circuit includes a plurality of switching elements for operating a level of an input signal, and a plurality of inductor elements by which switching is controlled by operation of said plurality of switching elements, said input signal being selectively output to said plurality of ranges by the switching control of said plurality of inductor elements in accordance with the operation of said plurality of switching elements.

9. The CATV tuner according to claim 7, wherein said high frequency filter circuit includes a combination circuit of a high pass filter and a low pass filter, each said filter having a variable cut-off frequency.

10. The CATV tuner according to claim 7, wherein
a down data of a frequency band different from that of said multiwave down signal is input from said CATV station through a cable to said receiving unit, and
said receiving unit includes a branching circuit branching and outputting said down data signal.

11. The CATV tuner according to claim 7, wherein said prescribed gain is variably set based on an input signal level at said high frequency amplifying unit.

* * * * *